United States Patent [19]
Craft

[11] Patent Number: 5,652,878
[45] Date of Patent: Jul. 29, 1997

[54] METHOD AND APPARATUS FOR COMPRESSING DATA

[75] Inventor: David John Craft, Austin, Tex.

[73] Assignee: International Business Machines Corporation, Armonk, N.Y.

[21] Appl. No.: 537,569

[22] Filed: Oct. 2, 1995

Related U.S. Application Data

[63] Continuation of Ser. No. 290,451, Aug. 15, 1994, abandoned, which is a continuation of Ser. No. 807,007, Dec. 13, 1991, abandoned.

[51] Int. Cl.[6] .............................. G06F 17/30; G06F 5/00
[52] U.S. Cl. ................................ 395/601; 341/55; 341/67
[58] Field of Search ....................... 364/DIG. 1, DIG. 2; 395/200, 275, 600, 700; 341/51, 55, 56, 60, 65, 67, 95

[56] References Cited

U.S. PATENT DOCUMENTS

| | | | |
|---|---|---|---|
| 3,914,586 | 10/1975 | McIntosh | 235/154 |
| 4,021,782 | 5/1977 | Hoerning | 340/172.5 |
| 4,054,951 | 10/1977 | Jackson et al. | 364/900 |
| 4,087,788 | 5/1978 | Johannesson | 340/146.3 AE |
| 4,286,256 | 8/1981 | Langdon, Jr. et al. | 340/347 DD |
| 4,295,125 | 10/1981 | Langdon, Jr. | 340/347 DD |
| 4,463,342 | 7/1984 | Langdon, Jr. et al. | 340/347 DD |
| 4,464,650 | 8/1984 | Eastman et al. | 340/347 DD |
| 4,467,317 | 8/1984 | Langdon, Jr. et al. | 340/347 DD |
| 4,558,302 | 12/1985 | Welch | 340/347 DD |
| 4,560,976 | 12/1985 | Finn | 340/347 DD |
| 4,586,027 | 4/1986 | Tsukiyama et al. | 340/347 DD |
| 4,612,532 | 9/1986 | Bacon et al. | 340/347 DD |
| 4,622,545 | 11/1986 | Atkinson | 340/747 |
| 4,622,585 | 11/1986 | Reitsman | 358/135 |
| 4,633,490 | 12/1986 | Goertzel et al. | 340/122 |
| 4,652,856 | 3/1987 | Mohiuddin et al. | 340/347 DD |
| 4,677,649 | 6/1987 | Kunishi et al. | 375/122 |
| 4,682,150 | 7/1987 | Mathes et al. | 340/347 DD |
| 4,701,745 | 10/1987 | Waterworth | 340/347 DD |
| 4,730,348 | 3/1988 | MacCrisken | 375/122 |
| 4,814,746 | 3/1989 | Miller et al. | 341/95 |
| 4,853,696 | 8/1989 | Mukherjee | 341/65 |
| 4,872,009 | 10/1989 | Tsukiyama et al. | 341/95 |
| 4,876,541 | 10/1989 | Storer | 341/51 |
| 4,891,643 | 1/1990 | Mitchell et al. | 341/107 |
| 4,891,784 | 1/1990 | Kato et al. | 364/900 |
| 4,899,147 | 2/1990 | Schiavo et al. | 341/60 |

(List continued on next page.)

FOREIGN PATENT DOCUMENTS

| | | |
|---|---|---|
| 0 380 294 | 8/1983 | European Pat. Off. . |
| 3-247123 | 11/1991 | Japan . |

OTHER PUBLICATIONS

Teuvo Kohonen, *Content-Addressable Memories*, Springer-Verlag Berlin Heidelberg, New York, 1980, pp. 1–9, 125–146, 191–210, and 268–271.

*Journal of the Association for Computing Machinery*, vol. 29, Oct. 1982, pp. 928–951, "Data Compression via Textual Substitution", J. A. Storer et al.

(List continued on next page.)

*Primary Examiner*—Thomas G. Black
*Assistant Examiner*—Maria N. Von Buhr
*Attorney, Agent, or Firm*—Thomas E. Tyson; Andrew J. Dillon

[57] ABSTRACT

A data compression apparatus including a circuit for receiving a data element, a storage circuit for sequentially storing previously received data elements at sequentially addressed fixed locations, a circuit for comparing the received data element to the stored data elements to determine whether the received data element matches at least one of the stored data elements, and a circuit for generating an address of the matching stored data element. In addition, a method of compressing data including the steps of receiving a data element, sequentially storing previously received data elements at sequentially addressed fixed locations, comparing the received data element to the stored data elements to determine whether the received data element matches at least one of the stored data elements, and generating an address of the matching stored data element.

20 Claims, 9 Drawing Sheets

U.S. PATENT DOCUMENTS

| | | | |
|---|---|---|---|
| 4,905,297 | 2/1990 | Langdon, Jr. et al. | 382/56 |
| 4,906,991 | 3/1990 | Fiala et al. | 341/51 |
| 4,935,882 | 6/1990 | Pennebaker et al. | 364/554 |
| 4,943,869 | 7/1990 | Horikawa et al. | 358/426 |
| 4,955,066 | 9/1990 | Notenboom | 382/56 |
| 4,973,961 | 11/1990 | Chamzas et al. | 341/51 |
| 4,988,998 | 1/1991 | O'Brien | 341/55 |
| 5,001,478 | 3/1991 | Nagy | 341/67 |
| 5,003,307 | 3/1991 | Whiting et al. | 341/51 |
| 5,016,009 | 5/1991 | Whiting et al. | 341/67 |
| 5,023,611 | 6/1991 | Chamzas et al. | 341/51 |
| 5,025,258 | 6/1991 | Duttweiler | 341/107 |
| 5,049,881 | 9/1991 | Gibson et al. | 341/95 |
| 5,051,745 | 9/1991 | Katz | 341/51 |
| 5,109,433 | 4/1992 | Notenboom | 341/51 |
| 5,130,993 | 7/1992 | Gutman et al. | 371/42 |
| 5,140,321 | 8/1992 | Jung | 382/40 |
| 5,155,484 | 10/1992 | Chambers, IV | 341/55 |
| 5,245,614 | 9/1993 | Gutman et al. | 370/118 |
| 5,293,379 | 3/1994 | Carr | 370/94.1 |
| 5,329,405 | 7/1994 | Hou et al. | 395/800 |

OTHER PUBLICATIONS

*IEEE Transactions on Communications*, vol. COM–34, No. 12, Dec. 1986, "Better OPM/L Text Compression", T. C. Bell, pp. 1176–1182.

*The Australian Computer Journal*, vol. 19, No. 2, May 1987, "A Linear Algorithm for Data Compression", R. P. Brent, pp. 64–68.

*Communications of the ACM*, Apr. 1989, vol. 32, No. 4, "Data Compression with Finite Windows", E. R. Fiala et al, pp. 490–505.

*Journal of the Association for Computing Machinary*, vol. 28, No. 1, Jan. 1981, "Linear Algorithm for Data Compression via String Matching", S. Even et al, pp. 16–24.

"Compression of Individual Sequences Via Variable–Rate Coding", J. Ziv and A. Lempel, *IEEE Transactions on Information Theory*, vol. IT–24, No. 5, Sep. 1978, pp. 530–536.

"A Universal Algorithm for Sequential Data Compression", J. Ziv and A. Lempel, *IEEE Transactions on Information Theory*, vol. IT–23, No. 3, May 1977, pp. 337–343.

"On the Complexity of Finite Sequences", A. Lempel and J. Ziv, *IEEE Transactions on Information Theory*, vol. IT–22, No. 1, Jan. 1976, pp. 75–81.

"Data Compression Format for 1/4–inch Data Catridge Tape Drives", QIC–122, Revision A, 18 Oct. 1989, Quarter–Inch Cartridge Drive Standards, Inc.

"IBM Journal of Research and Development", Nov. 1988, vol. 32, No. 6, pp. 777–795.

"USENIX Conference Proceedings", Jun. 10–14, 1991, pp. 385–403.

"IC–105 Compression Decompression Processor", Infochips Systems, Inc., No date.

"HA–105 SCSI Data Compression Storage Adapter", Infochips Systems, Inc., No date.

"9703 Data Compression Coprocessor", PRS–0003 Revision 1.01 (May 1990), Stac Electronics.

"9704 Data Compression Coprocessor", PRS–0006 Revision 1.01 (Feb. 1990), Stac Electronics.

"DCLZ Data Compression Format", QIC–130, Revision A, 16 Apr. 1991, Quarter–Inch Cartridge Drive Standards, Inc.

"AHA3101 Data Compression Coprocessor IC", Product Brief, Advanced Hardware Architectures, Inc., No date.

METHOD AND APPARATUS FOR COMPRESSING DATA

This is a continuation of application Ser. No. 08/290,451, filed Aug. 15, 1994, now abandoned, which is a continuation of application Ser. No. 07/807,007 filed Dec. 13, 1991, now abandoned.

TECHNICAL FIELD

The present invention is directed to an apparatus and method for compressing and decompressing data and more specifically to sequential data compression and decompression.

BACKGROUND ART

Many types of data compression systems exist. One commonly used technique is the Lempel-Ziv algorithm which is described in "Compression of Individual Sequences via variable Rate Coding" by Lempel and Ziv in IEEE Transactions on Information Theory, September, 1977, pages 530–536. FIGS. 1A–1C illustrate a typical implementation of the Lempel-Ziv algorithm. In FIG. 1A, a shift register 10 that is N+1 bytes long is used to temporarily store previously processed data. If new data to be processed includes a string of data bytes that have been processed before, then a token including the length and relative address of the previously processed data string in the shift register will be generated. This can in general be expressed using fewer bits of information than the data string itself, so the data string is effectively compressed. If the data to be processed does not form part of a previous data string existing in the shift register, then a token or tokens will be generated containing this data explicitly. In general, such tokens have to be expressed using slightly more bits of information than the data itself, so there is an effective expansion. Overall, the gain from the compressed data strings usually exceeds the losses from the non-compressed data strings, so overall data compression results. If there are no repeating strings of data in a data stream, then the data stream can not be compressed by this technique.

FIG. 1B illustrates the generation of a token referencing previously processed data. In the example given, the values A, B, C and D were previously processed and are currently stored in the shift register at addresses 37, 36, 35 and 34. New values to be processed are A, B, C and E. The new data includes the string ABC that has a length of 3 and matches previously stored string ABC at relative address 37. The address is relative because once a token is generated describing the string, the values A, B, and C will be loaded into the shift register and the values A, B, C and D will be shifted down the shift register to a new address. The address of data in the shift register is relative to the number of data values subsequently processed.

FIG. 1C illustrates the generation of a second token referencing previously stored data. In the example given, the values A, B, C and Z are to be processed. The new data includes the string ABC that has a length of 3 and matches previously stored string ABC at relative addresses 3 and 41. The token generated in this example is usually the lower relative address of 3. Tokens include the count and relative address of the previously processed string and are expressed as (count, relative address). As a result of the compression of the values A, B, C, E, A, B, C and Z as shown in FIGS. 1B and 1C, the generated processed output will include: (3, 37), E, (3, 3), Z.

One of the primary problems with implementations of the Lempel-Ziv compression technique is the difficulty in performing the search operation for previous matching strings at an effective processing speed. Many techniques discussed below are modifications of the Lempel-Ziv technique that attempt to improve the speed of the technique by improving the speed of the search operation or the amount of compression achieved by using more efficient token encoding. U.S. Pat. No. 4,021,782 teaches a compaction device to be used on both ends of a transmission line to compact, transmit, and decompact data. Each possible incoming character is categorized according to an expected frequency of use in a preset coding table. The category of the character affects the encoding of that character (more frequently used characters have shorter generated code).

U.S. Pat. No. 4,464,650 discloses parsing an input data stream into segments by utilizing a search tree having nodes and branches.

U.S. Pat. No. 4,558,302 teaches what is commonly called a Lempel-Ziv-Welch data compression technique. This patent discloses utilizing a dictionary for storing commonly used data strings and searching that dictionary using hashing techniques.

U.S. Pat. No. 4,612,532 discloses interchanging positions of candidates or ordering the table of candidates in approximate order of frequency.

U.S. Pat. No. 4,622,585 describes compression of image data. This patent discloses a first series of data bits in a current picture line and a second series of data bits of a preceding picture line being shifted together in a compression translator.

U.S. Pat. No. 4,814,746 describes utilizing a dictionary for storing commonly, used data strings and deleting from that dictionary the data strings not commonly used.

U.S. Pat. No. 4,853,696 describes a plurality of logic circuit elements or nodes connected together in reverse binary treelike fashion to form a plurality of logic paths corresponding to separate characters.

U.S. Pat. No. 4,876,541 is directed to improvements to the Lempel-Ziv-Welch data compression technique described above by using a novel matching algorithm.

U.S. Pat. No. 4,891,784 is directed to an auto blocking feature in a tape environment which utilizes a packet assembly/disassembly means for auto blocking.

U.S. Pat. No. 4,899,147 is directed to a data compression technique with a throttle control to prevent data underruns and an optimizing startup control. This patent discloses a capability to decompress data read in a reverse direction from which it was written. This patent also discloses a string table for storing frequently used strings with a counter of the number of times the string has been used.

U.S. Pat. No. 4,906,991 is directed to copy codeword encoding which utilizes a tree data structure.

U.S. Pat. No. 4,988,998 is directed to preprocessing strings of repeated characters by replacing a sequentially repeated character with a single character and repeat count.

Summary of the Invention

The present invention includes a data compression apparatus including a circuit for receiving a data element, a storage circuit for sequentially storing previously received data elements at sequentially addressed fixed locations, a circuit for comparing said received data element to said stored data elements to determine whether said received data element matches at least one of said stored data elements, and a circuit for generating an address of said matching stored data element.

In addition, the present invention includes a method of compressing data including the steps of receiving a data element, sequentially storing previously received data elements at sequentially addressed fixed locations, comparing said received data element to said stored data elements to determine whether said received data element matches at least one of said stored data elements, and generating an address of said matching stored data element.

A further understanding of the nature and advantages of the present invention may be realized by reference to the remaining portions of the specification and drawing.

BEST MODE FOR CARRYING OUT THE INVENTION

A major difficulty with a hardware decoder implementation of the Lempel-Ziv technique discussed above is the use of a relative addressing scheme. Such a scheme requires the use of a shift register to hold previously processed data words, one word in each data element. Each incoming data word is shifted into the first position of the shift register while all the previously processed data words are shifted into adjacent positions. In addition, a random access capability is required to each element of the shift register. This requires much more circuitry, chip area, and power to implement than a simple random access memory.

The present invention uses a fixed addressing scheme that allows the stored previously processed data to remain in a fixed location in memory. This permits a very simple, fast hardware decoder implementation using a simple random access memory and two address counters. For the encoder, a correspondingly simple organization is proposed, using a context addressable memory, or CAM, for storage of the previously processed data rather than a random access memory or RAM. This significantly decreases the search overhead requirements for each word operation while performing an exhaustive string matching process. This improves the compression ratio, as well as allowing very fast encoder throughput. An additional benefit is that a large part of both the encoder and decoder are commonly used structures, lending themselves well to VLSI implementation in silicon.

Figure 2:
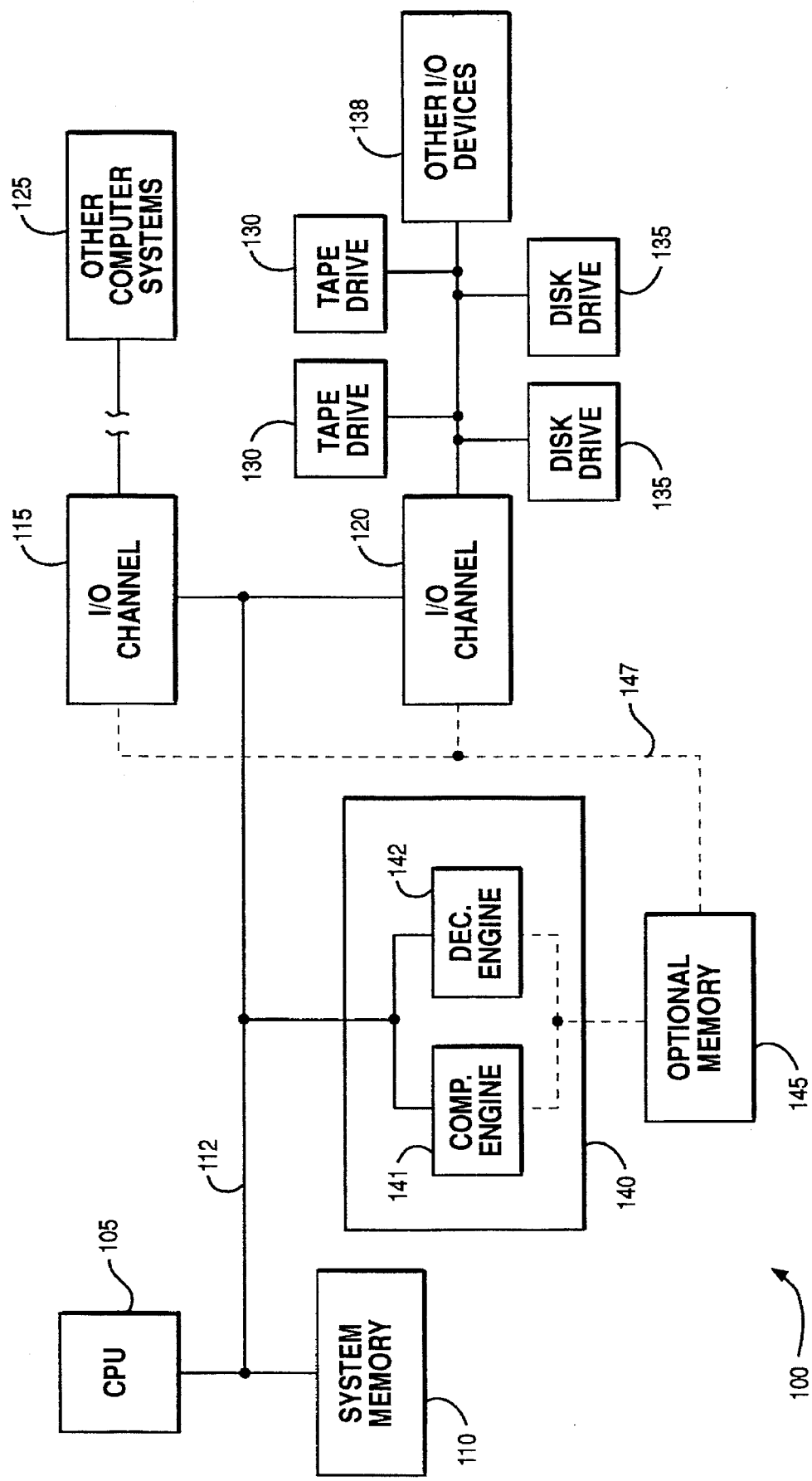
FIGS. 2 and 3 are illustrations of various system configurations utilizing a preferred embodiment of the invention.
Figure 3:
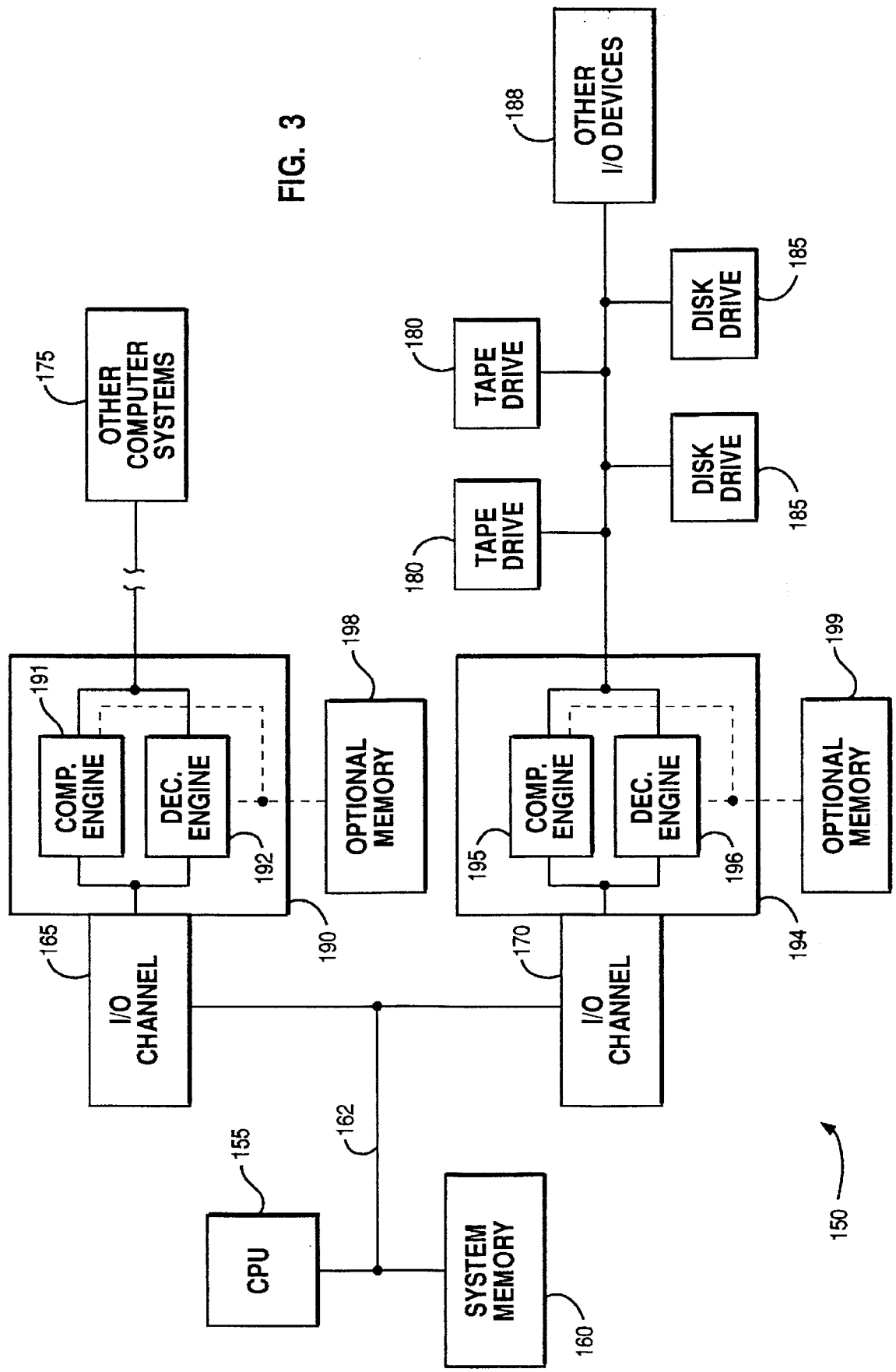

FIGS. 2 and 3 are illustrations of various system configurations utilizing a preferred embodiment of the invention. As shown in FIG. 2, a computer 100 includes a central processing unit (CPU) 105 that communicates with system memory. 110. The CPU also communicates on bus 112 with input/output channels or adapters 115 and 120. Through the input/output channels, the CPU may communicate with other computer systems 125, tape drives 130, disk drives 135, or other input/output devices 138 such as optical disks. In the preferred embodiment, computer 100 may also include a compression/decompression engine 140 on bus 112. The compression/decompression engine includes compression engine 141 and decompression engine 142. These engines may be invoked by an operating system file handler running on the CPU to do compression or decompression of data being transmitted or received through the input/output channels. The engines may utilize system memory 110 or an optional memory 145 while performing the desired compression or decompression of data. If optional memory 145 is used, the compressed or decompressed data may be transmitted directly to and from the I/O channels on optional bus 147.

FIG. 3 illustrates a computer 150 including a CPU 155 and system memory 160. The CPU communicates on bus 162 with input/output channels or adapters 165 and 170. Through the input/output channels, the CPU may communicate with other computer systems 175, tape drives 180, disk drives 185 or other input/output devices 188. Coupled to the input/output channels are compression/decompression engines 190 and 194 for compressing and decompressing some or all data passing through the input/output channels. The compression/decompression engines include compression engines 191, 195 and decompression engines 192, 196. The engines may also have optional memories 198 and 199 for working as buffers and for handling space management tasks as the data is compressed or decompressed.

There are many other alternative system configurations utilizing a preferred embodiment of the invention that are apparent to those of ordinary skill in the art. For example, one computer system, such as a server, may include a data compression engine for compressing all data sent to it while the remaining computer systems may each include a decompression engine to decompress all data they receive from the server.

Figure 4:
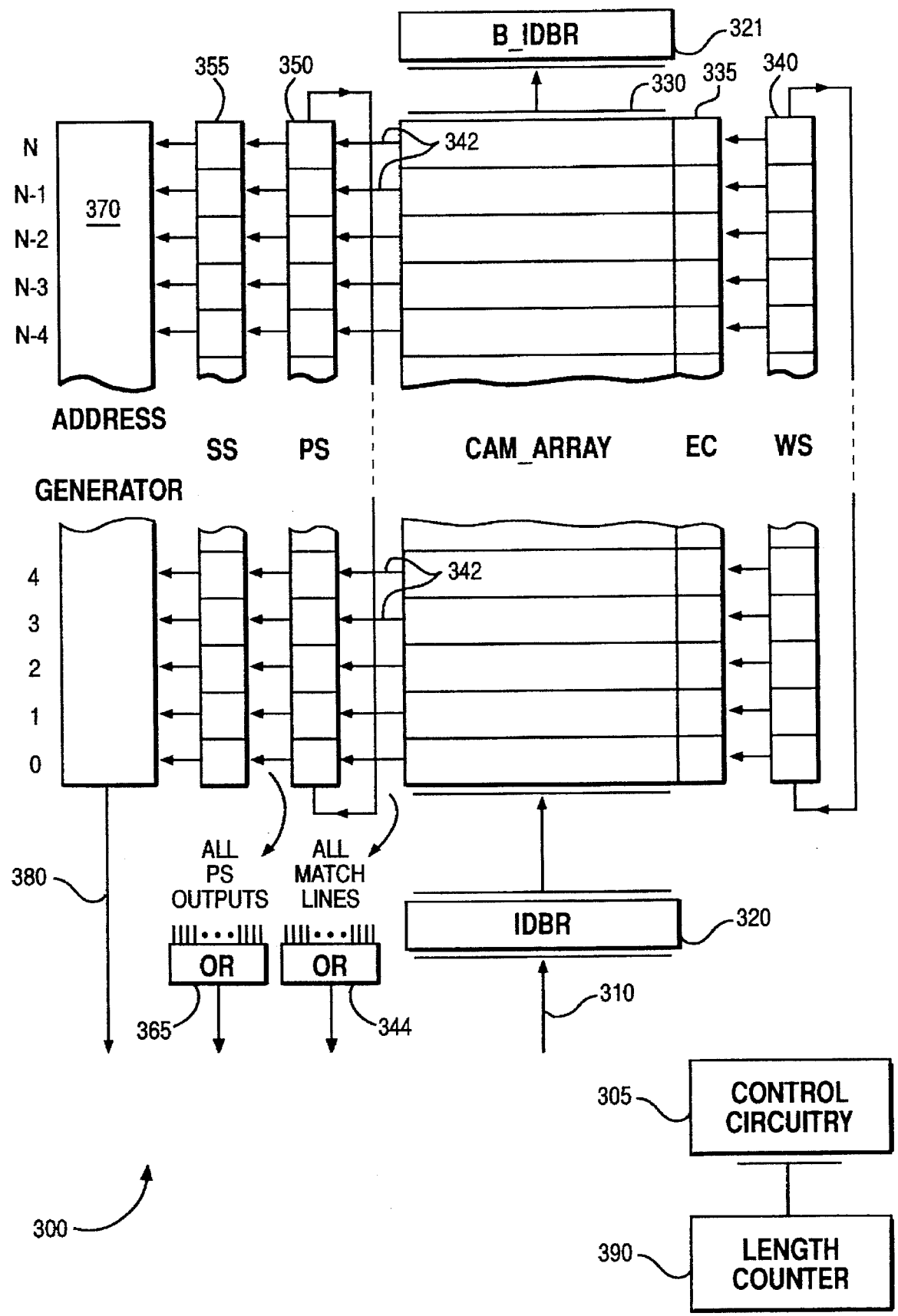
FIG. 4 is a block diagram illustrating a preferred data compression engine.

FIG. 4 is a block diagram illustrating a preferred data compression engine 300. The operation of the various elements of the data compression engine are controlled by a control circuit 305 which is coupled to each of the elements described below. The control circuit is a logic circuit which operates as a state machine as will be described in greater detail below. Data enters the compression engine on input data bus 310 into input data buffer register (IDBR) 320 and is later stored in a backup input data buffer 321. The data stored in the input data buffer is then compared with all current entries in a content addressable memory (CAM) array 330. The CAM array includes many sections (N+1 sections are shown in the figure), each section including a register and a comparator (as will be described in greater detail in FIG. 5 below). Each CAM array register stores a word of data and includes a single storage element, called an empty cell 335, for indicating whether a valid or current data word is stored in the CAM array register. Each comparator generates a match or active signal when the data word stored in the corresponding CAM array register matches the data word stored in the input data buffer (plus some other criteria described below). Coupled to the CAM array is a write select shift register (WS) 340 with one write select cell for each section of the CAM array. In the preferred embodiment, there is a single write select cell set to 1 or active while the remaining cells are set to 0 or inactive. The active write select cell selects which section of the CAM array will be used to store the data word currently held in the input data buffer. The write select shift register will then be shifted one cell to determine which CAM array cell will store the next data word in the input data buffer. The use of the write select shift register provides for many of the capabilities of the above described prior art Lempel-Ziv shift register while also allowing the use of fixed addresses.

Current entries in the CAM array are designated as those CAM array sections that have empty cells (EC) set to 1 and have corresponding write select (WS) cells set to 0. If the data in any of the current CAM entries matches the data word in the input data buffer, then the comparator for that CAM array section will generate an active match signal on its corresponding one of the match lines 342. As a result, a match OR gate 344 that is coupled to each of the match lines will generate a match signal.

The primary selector shift register (PS) 350 is used to indicate those corresponding sections in the CAM array where the matching operation has been successful so far. That is, the PS cells that are set to 1 (active) indicate which CAM array section contains the last word of a matching string, or sequence, of data words. Multiple cells in the PS column may be active because there could be a number of locations in the CAM array where the incoming string of data words has occurred before. If the incoming stream of data words has not occurred before, then raw data tokens are generated that contain the stream of data words until a stream of data words is found that does match previously processed data.

Prior to loading another new data word into the input data buffer, the previous entry in the input data buffer is saved in backup input data buffer register (B_IDBR) 321. In addition, the contents of the column of PS cells is saved in a corresponding secondary selector (SS) register 355. Furthermore, a length counter is incremented by 1 to maintain a length of the matching string. Finally, the primary selector and write selector cells are shifted one location such that the entry for an Mth PS cell is now stored in an (M+1)th PS cell and the entry for an Mth WS cell is now stored in an (M+1)th WS cell. This shift operation accomplishes two things. First, it shifts the single active write selector entry one cell so the next incoming data word is written into the next sequential section of the CAM array. Secondly, it shifts the active cells in the primary selector column so they each correspond to the CAM array sections immediately subsequent to the previous matching CAM array sections.

Once the new incoming data word has been loaded into the input data buffer, it is compared to all the current entries in the CAM array as described above. The corresponding match lines will be active for all CAM array data cell entries that match the new data word. If any of the match lines is active, then the match OR gate will be active. All active PS cells whose corresponding match lines are not active, are cleared. If any of the PS cell entries remain active, indicating that the current data word in the input data buffer extends the previous matching string of data words, then a PS OR gate 365 coupled to each of the PS cells will be active. Therefore, the next data word can be processed to determine whether it may also continue the matching string of data words stored in the CAM array. This matching process continues until there is a 0 at the output of the PS OR gate, signifying that there are now no matches left. When this occurs, the values marking the end points of all the matching strings existing prior to this last data word are still stored in the SS cells. Address generator 370 then determines the location of one of the matching strings and generates its address on bus 380. The address generator may be a logic circuit utilized to generate an address given a signal from one or more of the cells of the secondary selector. Such a logic circuit may be easily designed by one of ordinary skill in the art. The length of the matching string has been tracked by length counter 390.

The address generator generates the fixed (also known as absolute) address of the CAM array section containing the end of the matching string and the length counter provides the length of the matching string. Therefore, a start address and length of the matching string can be calculated, encoded and generated as a token. This process is described in greater detail below.

One advantage of using a fixed address to store data words is that the data words do not need to be shifted from register to register, which could require additional circuitry. The present invention uses a shifting wraparound write select cell to determine which fixed address CAM array cell to write information to and utilizes the features of a content addressable memory to do the many needed comparisons to find matches with previous strings of data. As a result, the present invention performs compression more quickly and efficiently.

The present invention also provides for more effective compression than many existing Lempel-Ziv techniques because the search for matching data strings is exhaustive. That is, the CAM array allows for an exhaustive search for all possible matching strings. Many existing techniques use a compromising technique such as hashing in order to reduce the search time but which may not find the longest matching string in memory.

Figure 5:
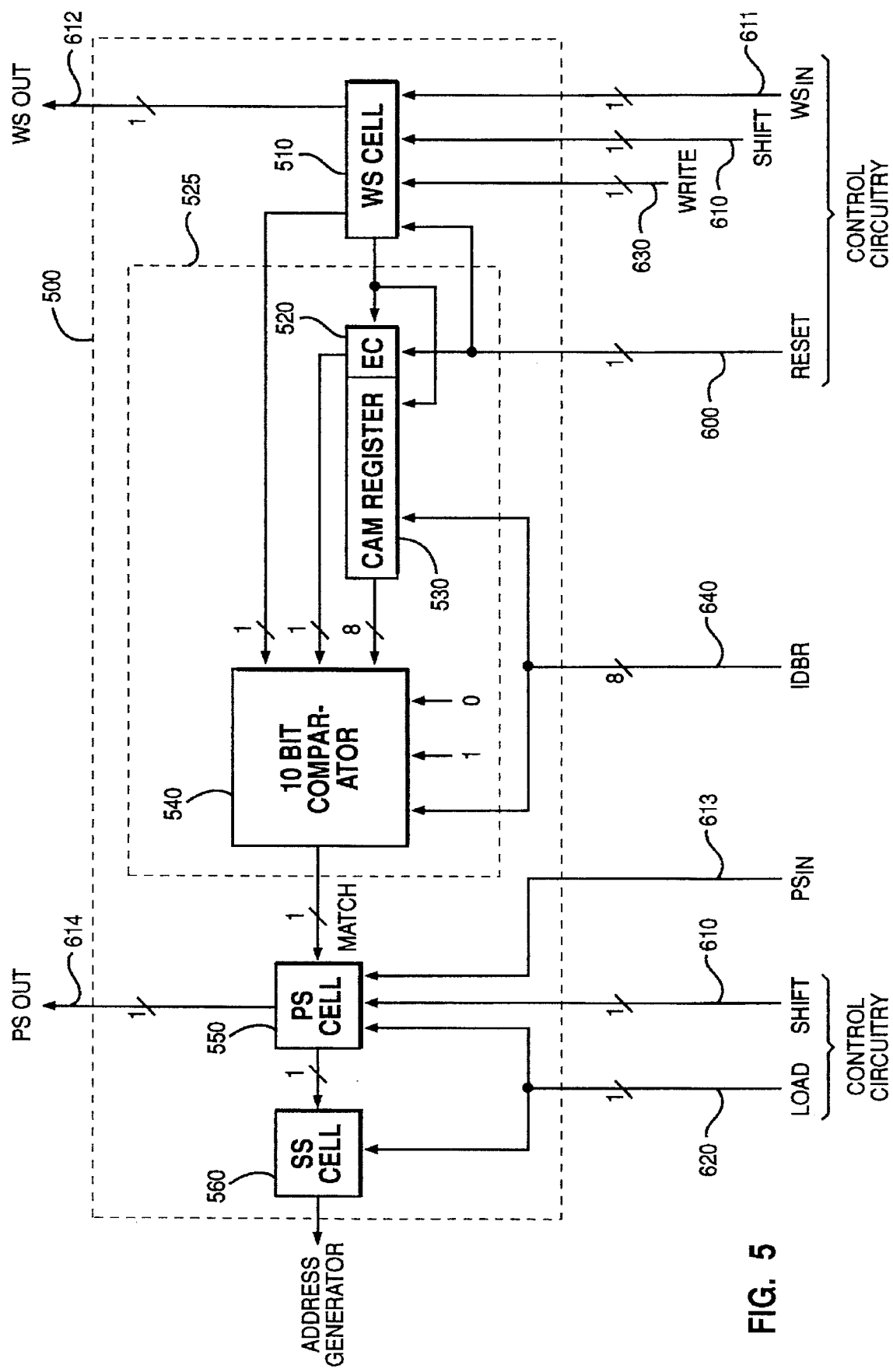
FIG. 5 is a block diagram illustrating a single section of the compression engine.

FIG. 5 is a block diagram illustrating a single section of the compression engine. This section 500 includes a write select cell 510, a CAM array section 525, a primary selector cell 550 and a secondary selector cell 560. The CAM array section includes a comparator 540 and a register 530 which includes an empty cell 520. Each of these elements is coupled to the control circuitry 305 described above.

A reset signal line 600 is utilized by the control circuitry to clear the write select cell 510 and empty cell 520 to 0 when the reset signal line is active. A shift signal line 610 is utilized to shift the value in write select cell 510 and primary selector cell 550 to the next CAM array section as well as to receive the value stored in the previous CAM array section. If the Mth cell is the last cell in the CAM array, then the in the cell will be wrapped around to the first cell in the CAM array. WS in and out lines 611 and 612 and PS in and out lines 613 and 614 carry the value in the WS and PS cells to and from the subsequent and previous WS and PS cells. A load signal 620 is utilized to load the value from the primary selector to the secondary selector. A write signal line 630 is utilized to initiate a write of data to the CAM array register as well as to turn the empty cell to a value of 1. An input data buffer line 640 is utilized to transfer data from the input data buffer to the CAM array register during a write or to the comparator whenever a comparison is performed.

If the write selector cell is already active (set to a value of 1), a write signal to the write selector cell 510 will cause the write select cell to generate a signal to the empty cell and the CAM array register. The empty cell will then be set to 1 and the CAM array register will have the data on the input data buffer bus 640 written into the CAM array register. The value on the input data buffer bus and the hard coded 1 and 0 are compared by comparator 540 to the value in CAM array register 530, the value of empty cell 520 and the value of write select cell 510. If the write select cell is set to 0 and the empty cell is set to 1 and the value in the input data buffer is equal to the value in the CAM array register, then comparator 540 will generate a matched signal to the primary selector. Otherwise the comparator will generate a non-matched signal to the primary selector.

In the preferred embodiment, there are 2,048 sections in the CAM array, thereby requiring the use of at least 11 bits to designate the address of a string within the CAM array. In the preferred embodiment, the CAM array may be 2,048 sections connected in parallel or it may be 4 sets of 512 sections coupled in parallel. In an alternative embodiment, the CAM array may be 1,012 sections deep, thereby requiring at least a 10 bit address description or 512 bits requiring at least a 9 bit address. Alternative embodiments may allow the use of different size CAM arrays.

Figure 6A:
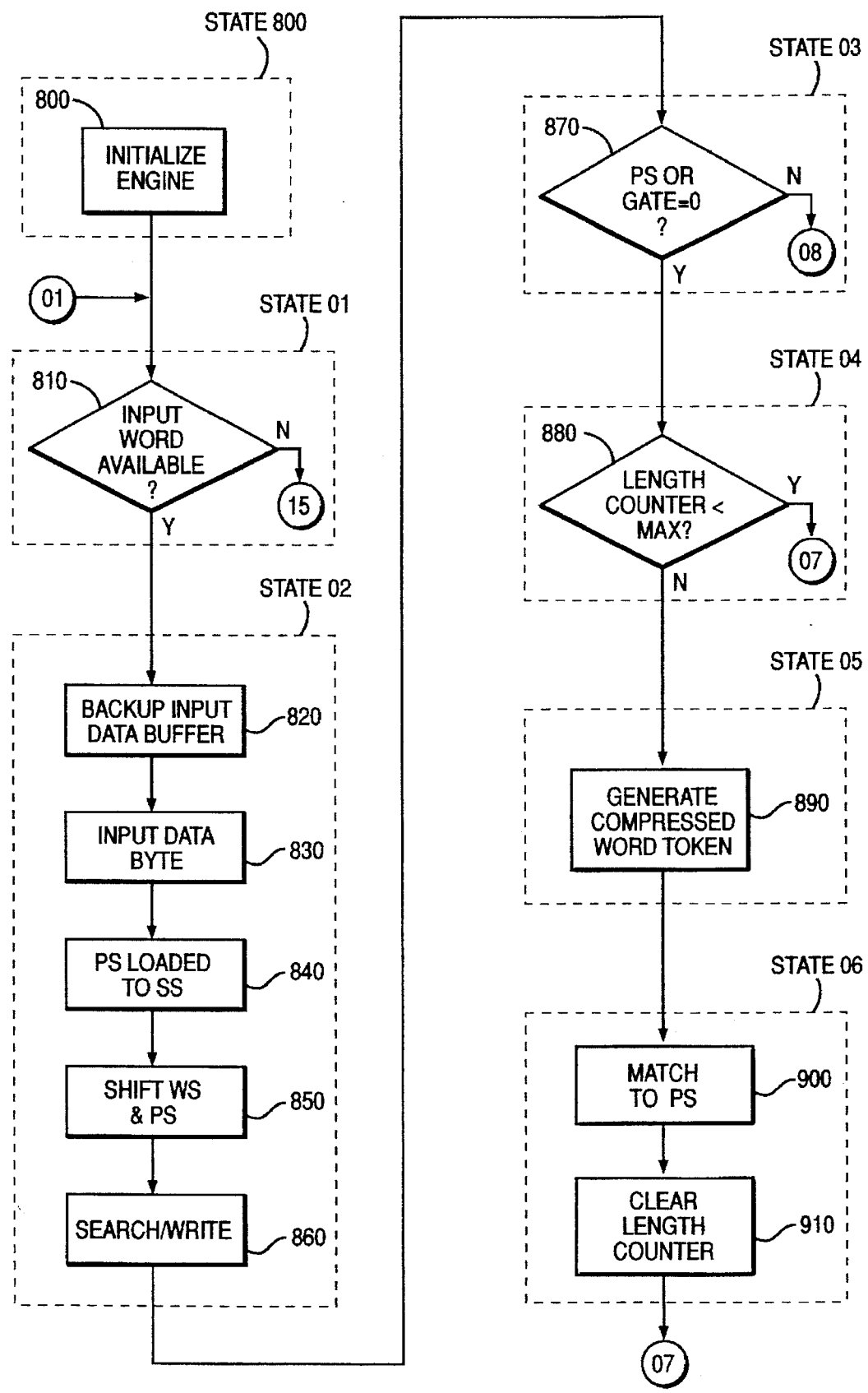
FIGS. 6A–6C is a flowchart describing a preferred process utilized to run the compression engine.
Figure 6B:
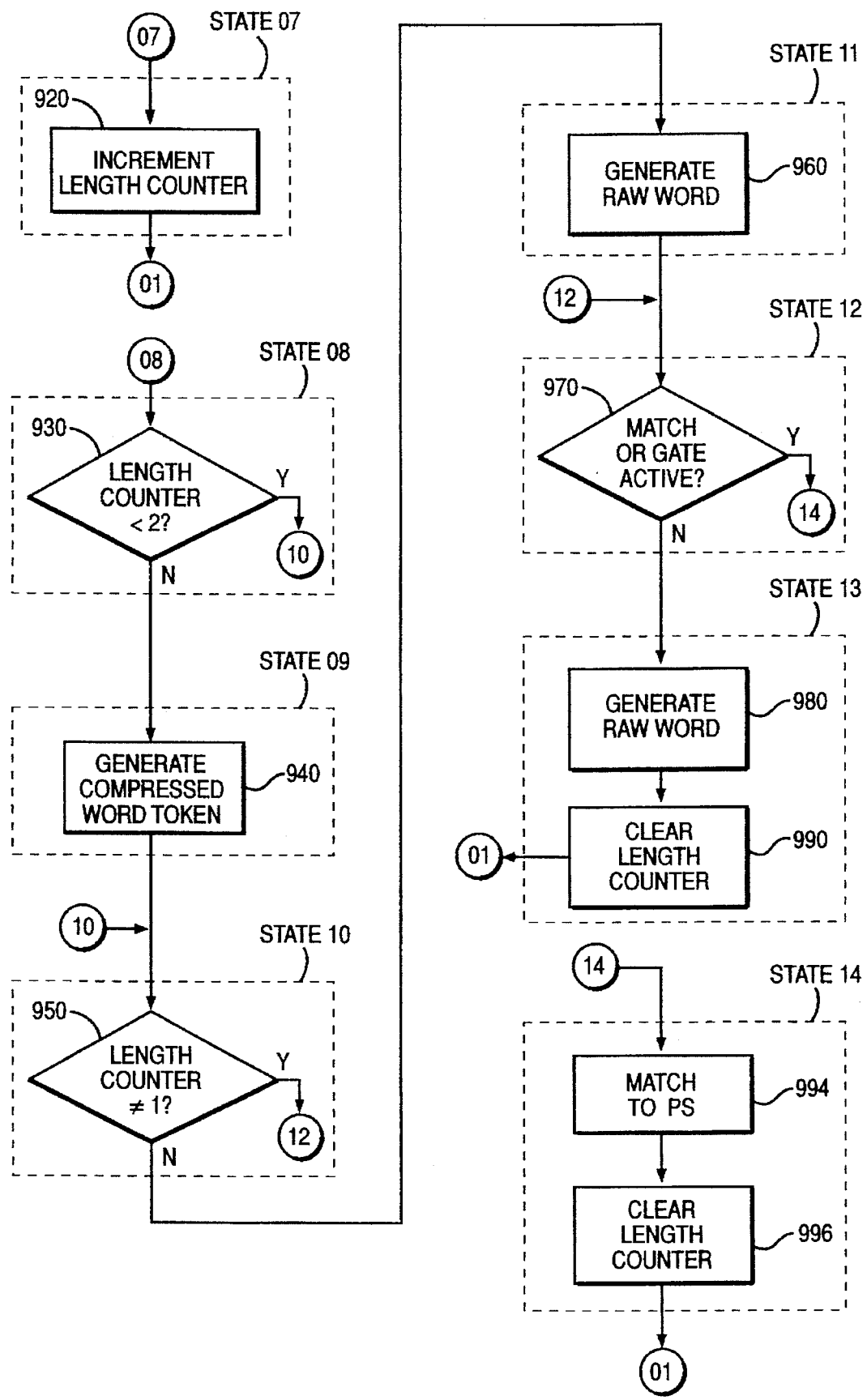
Figure 6C:
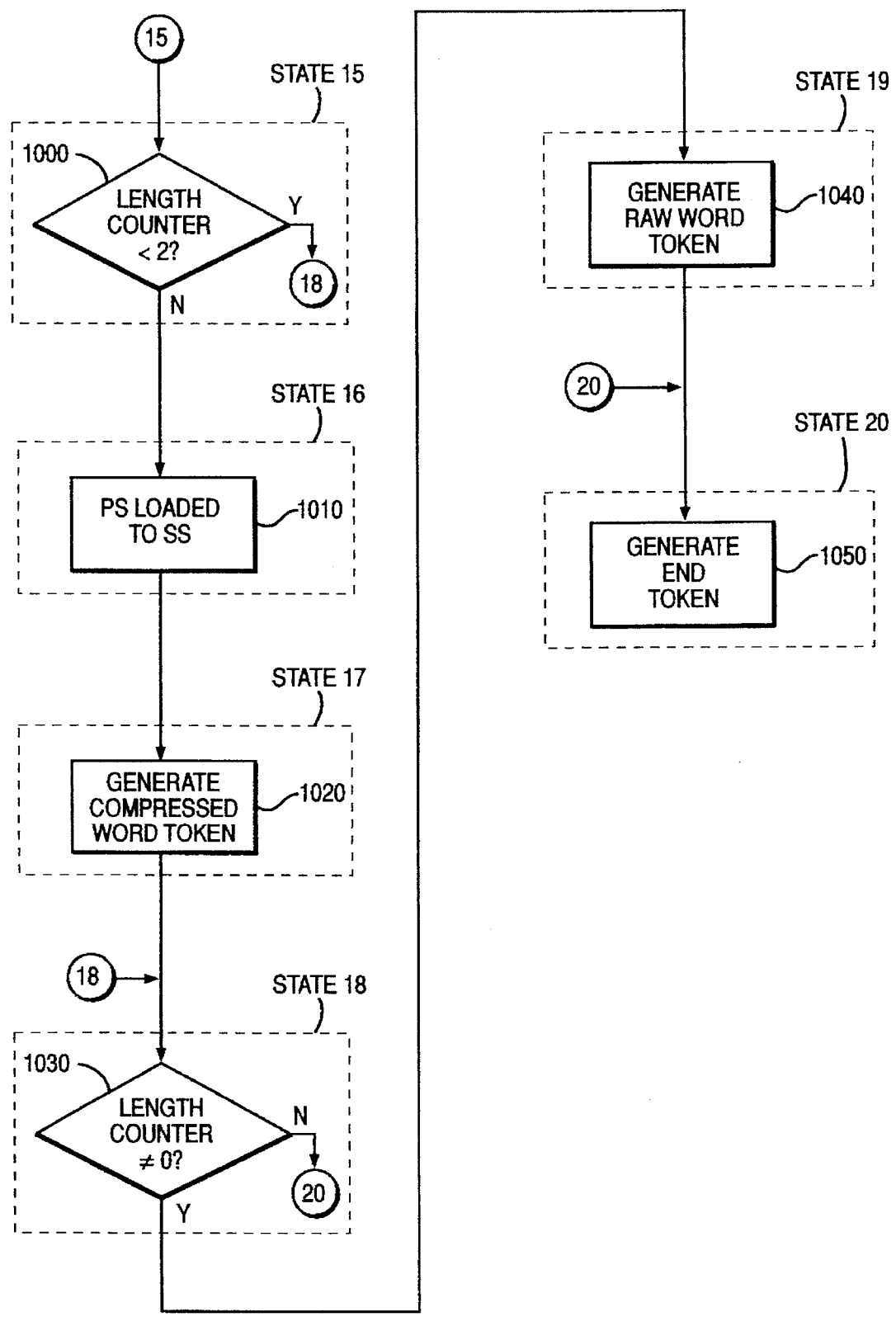

FIGS. 6A–6C is a flowchart describing the process utilized to run the compression engine. In the preferred embodiment, the flowcharted process is accomplished with 21 states. The flowchart will now be described with reference to the 21 states.

In a first state 00 and step 800, the compression engine is initialized by clearing the length counter to 0, clearing all the primary selectors, clearing all the empty cells in the CAM array to 0, clearing all the write select cells to 0 and setting the last write select cell (N) to 1. Because the empty cells are all cleared to 0, the entries in the CAM array registers do not need to be cleared, thereby saving time and decreasing power requirements. Execution then proceeds to state 01.

In state 01 and step 810, if an input word is not available on the input data bus for loading into the input data buffer, then execution will proceed to state 15, otherwise execution will proceed to state 02. This is to handle the end of file condition wherein there are no more input data words to be compressed.

In state 02 and steps 820–860, the data word in the input data buffer is moved to the backup input data buffer and the next data word on the input data bus is read into the input data buffer. In addition, the data in the primary selector is loaded into the secondary selector to store the results of any previous string matching operations that have occurred so far. Furthermore, the primary selectors and write selectors are shifted one position. The write selectors are shifted one position to designate the next CAM array cell to be written to (only a single write cell has a value of 1). The primary selectors are shifted one position in preparation for the next compare. This is to check whether the next input data word will match any of the data words in the CAM array that follow previously successful string matches. Finally, a search/write function is performed on the CAM array. This function first compares the data word in the input data buffer with each of the data words stored in each of the sections in the CAM array that have a corresponding empty cell set to 1 (designating that the CAM array cell contains data) and a write select cell set to 0 (designating that the cell is not the next one to be written to). If there are any matches, then the corresponding match lines are set to 1, and the corresponding primary selector cells remain at 1 if they were previously set to 1. In the case at the first input data word, there are no previously matched strings as indicated by all the primary selector cells set to 0. If any match lines or primary selector cells are set to 1, then the primary selector OR gate will generate a value of 1. Subsequently, the data word in the input data buffer is written to the CAM array register with a corresponding write select cell equal to 1. Execution then proceeds to state 03.

In state 03 and step 870, execution proceeds to state 08 if the primary selector OR gate is 0, otherwise execution proceeds to state 04. This is to determine whether a previously matched string continues to match entries in the CAM array.

In state 04 and step 880, execution proceeds to state 07 if the length counter is less than the length counter's maximum value otherwise execution proceeds to state 05. In the preferred embodiment, the maximum value is 271 due to the coding used to generate the tokens that describe the string as will be described in greater detail below. In alternative embodiments, the maximum value may be based on the maximum value the length counter can store.

In state 05 and step 890, a compressed word token is generated. The token has a length value equal to the length counter value minus 2. The token also has a displacement value equal to the address of the lowest set secondary selector (indicating the cell with the last matching word to the input data string) minus the length counter value plus 1 (indicating the address at the first matching word in the CAM array to the input data string). Execution then proceeds to state 06.

In state 06 and steps 900–910, the primary selector cells to the values of the corresponding match lines. This clears the previous PS values and starts the next possible matching string. In addition, the length counter is cleared to 0. Execution then proceeds to state 07.

In state 07 and step 920, the length counter is incremented by one and execution is returned to state 01 for starting work on the next data word.

State 08 is executed if the current data word in the input data buffer does not continue to match any string of data words in the CAM array. In state 08 and step 930, execution proceeds to state 10 if the length counter is less than two. If the length counter is two or more, then the data word in the input data buffer ends a previous string of matching data words.

In state 09 and step 940, a compressed word token is generated. As described in state 05, the compressed word token has a length value equal to the length counter value minus 2 and a displacement value or length equal to the address of the lowest set secondary selector minus the length counter value plus 1. Execution then proceeds to state 10. In the alternative, execution could proceed directly to state 14.

In state 10 and step 950, execution proceeds to state 12 if the length counter value is not equal to one, otherwise execution proceeds to state 11.

In state 11 and step 960, a raw word token is generated using the data value in the backup data buffer. Execution then proceeds to state 12. In the alternative, execution could proceed directly to state 14.

In state 12 and step 970, execution proceeds to state 14 if match is equal to one, otherwise execution proceeds to state 13.

In state 13 and steps 980–990, a raw word token is generated using the data value on the backup data buffer. The length counter is then cleared to 0. Execution then proceeds to state 01.

In state 14 and steps 994–996, the primary selectors are set equal to the values of the match lines. This is to start the matching of a new string of words. In addition, the length counter is cleared to 0. Execution then proceeds to state 01.

States 15–20 are executed if there are no more data words on the input data buffer (see state 01). In state 15 and step 1000, if the length counter is less than 2, then execution proceeds to state 18, otherwise execution proceeds to state 16.

In state 16 and step 1010, the values in the primary selectors are loaded into the secondary selectors. Execution then proceeds to state 17.

In state 17 and step 1020, a compressed word token is generated as previously shown in states 05 and 09. The compressed word token has a length value equal to the length counter value minus 2 and a displacement value equal to the address of the lowest set secondary selector minus the length counter value plus 1. Execution then proceeds to state 18. In the alternative, execution could proceed directly to state 20.

In state 18 and step 1030, if the length counter is equal to 0000, then execution proceeds to state 20, otherwise execution proceeds to state 19.

In state 19 and step 1040, a raw word token is generated using the data value in the backup data buffer. Execution then proceeds to state 20.

In state 20 and step 1050, an end marker token is generated.

Figure 7:
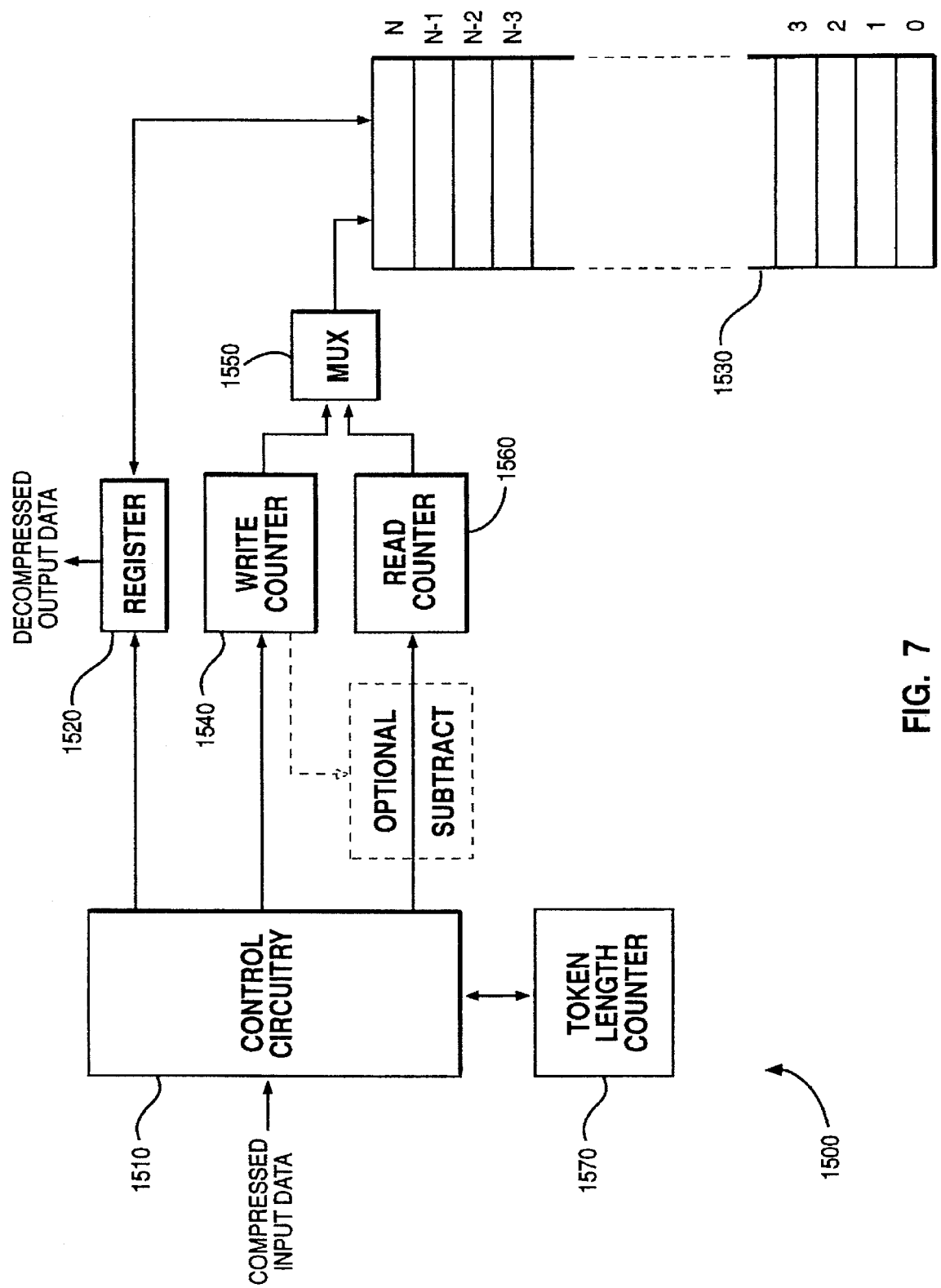
FIG. 7 is a block diagram illustrating a preferred decompression engine.

FIG. 7 is an illustration of a preferred decompression engine 1500 to decompress data generated by the preferred compression engine. Control circuitry 1510 receives the compressed data stream including raw tokens (a data word preceded by a 0), compressed data tokens (a length of a string and a start address) and an end marker token (e.g. 13 1s in a row).

If a raw token is received, the enclosed data word is stored in register 1520. The contents of the register are then written to a history buffer 1530 (with the same number of sections as the CAM array used to compress the data) at the address in a write counter 1540 (initially set to 0) through address multiplexer 1550. In addition, the content of the register is also generated as an output data word. The write counter is then incremented by one. If the write counter is already at N, then it is set to 0. As a result of this operation, each data word is written to the next subsequent section in the history buffer, thereby mirroring the CAM array used during data compression, and the data word is also generated as output.

If a compressed data token is received, the address is loaded into a read counter 1560 and the length is loaded into token length counter 1570. The data in the history buffer array addressed by the read counter through multiplexer 1550 is then read into register 1520. That data word is then written to the history buffer at the address in the write counter to continue the mirroring of the CAM array used to compress the data. The data word in the register is also generated as an output data word. The write counter is then incremented by one as described above. If the token length counter is greater than one, then it is decremented by one, the read counter is incremented by one, and the process repeats for the next data word. This process repeats until the whole data string referred to by the compressed data string has been sequentially read from the history buffer, written back into the history buffer, and generated as output.

Figure 1A:
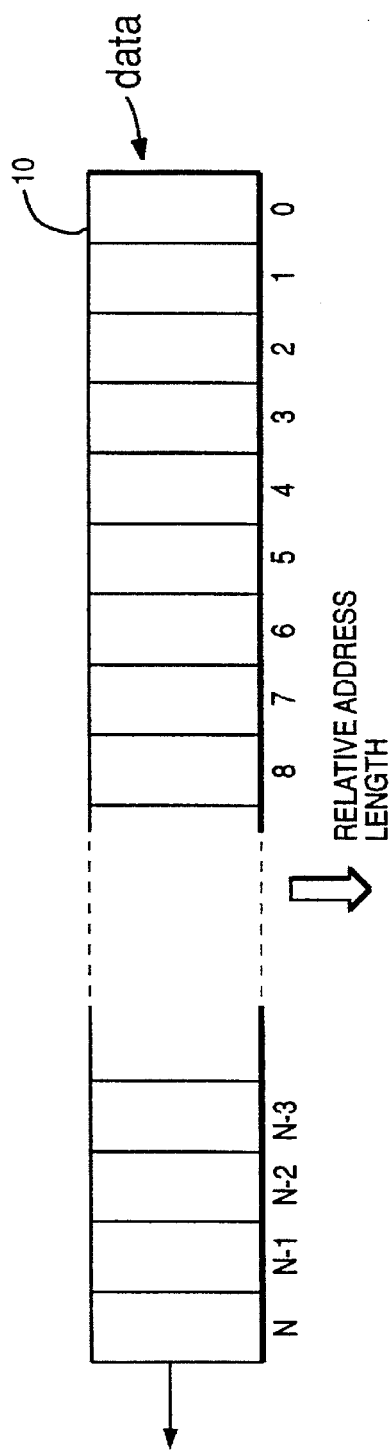
FIGS. 1A–1C are diagrams of a prior art technique for compressing data.
Figure 1B:
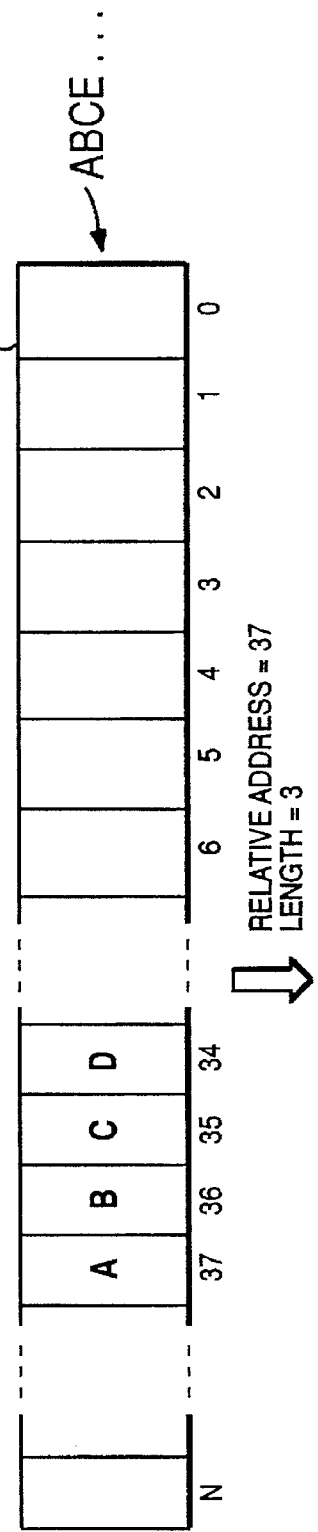
Figure 1C:
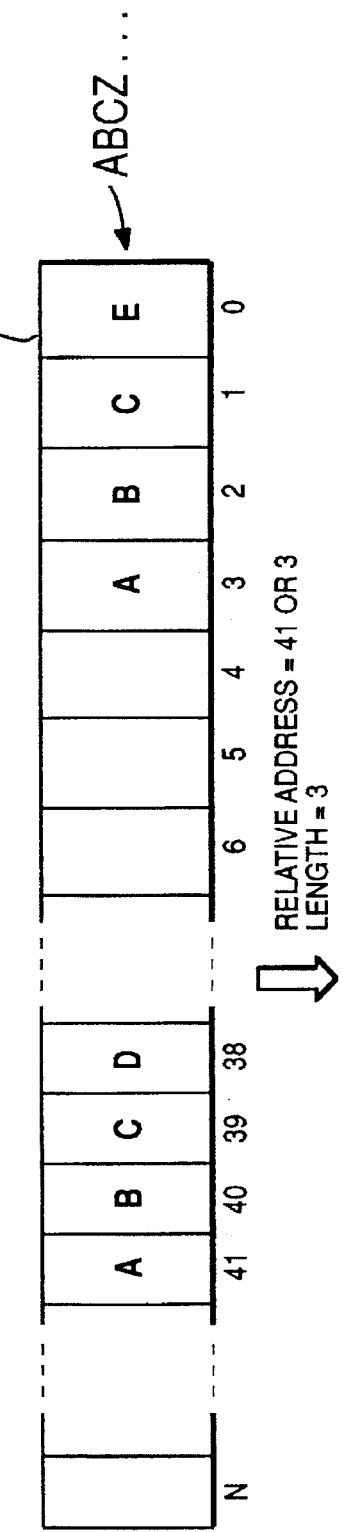

An optional subtract unit 1580 may be included to allow this decompression engine to decompress Lempel-Ziv compressed data that utilizes relational addresses as described in FIGS. 1A–1C. This subtract circuit would be used to convert the relational address to a fixed address by subtracting the value in the write counter from the relational address. The subtract circuit could also be included but disabled when decompressing data compressed by the preferred embodiment of the invention and enabled when decompressing Lempel-Ziv compressed data using relational addresses.

In the preferred embodiment, a raw word token is generated as a 0 followed by the raw word. A compressed word token is passed as a 1 followed by the length of the matching string and the starting location of the matching string in the CAM array (called the displacement). A control token may also be generated which starts with eight 1's and is followed with four bits designating the control instructions. Finally, an end token is passed to designate the end of a compressed data stream. The end token is thirteen 1's in a row.

Table 1 shows the codes used in the preferred embodiment to designate the length of a compressed data word string. This type of coding is a modified logarithmic coding wherein shorter strings utilize shorter codes and longer strings utilize longer codes. This is a useful coding technique when the frequency of shorter strings is substantially greater than the frequency of longer strings. The displacement is specified with an 11 bit value in the preferred embodiment. A shorter displacement may be used with a CAM array having fewer sections.

TABLE 1

Codes Used to Designate Compressed Word Length

| Code Field | Compressed Word Length |
|---|---|
| 00 | 2 words |
| 01 | 3 words |
| 10 00 | 4 words |
| 10 01 | 5 words |
| 10 10 | 6 words |
| 10 11 | 7 words |
| 110 000 | 8 words |
| ... ... | ... ... |
| ... ... | ... ... |
| 110 111 | 15 words |
| 1110 0000 | 16 words |
| ..... ..... | ... ... |
| ..... ..... | ... ... |
| 1110 1111 | 31 words |
| 1111 0000 0000 | 32 words |
| ..... ..... ..... | ... ........ |
| ..... ..... ..... | ... ........ |
| ... ... ... | ... ........ |
| 1111 1110 1111 | 271 words |

In order to provide for future expansion of the invention, control instructions may be passed in the compressed data stream. These control instructions may include instructions such as reset the history buffer, preload the history buffer with a preferred data set, etc. In the preferred embodiment, there are two types of control instructions, long and short. Table 2 illustrates long control instructions wherein a 12 bit control field is given followed by an 11 bit control subfield. This provides for 2048 subfields for each of the four control fields for a total of 8208 possible long instructions.

TABLE 2

Long Instruction Control Fields and Subfields

| Long Control Field | Control Subfield |
|---|---|
| 1111 1111 0000 | 0000 0000 000–1111 1111 111 |
| 1111 1111 0001 | 0000 0000 000–1111 1111 111 |
| 1111 1111 0010 | 0000 0000 000–1111 1111 111 |
| 1111 1111 0011 | 0000 0000 000–1111 1111 111 |

Table 3 illustrates the short control instructions. The short control instructions are only 12 bits long and are, therefore, fewer in number than the total number of long control instruction. However, the short control instructions require less time to transmit. As described above, one short control field has already been defined as an end marker. The end marker is a 1 (defining the following bits as being either a compressed data token or as a control instruction) followed by the twelve bit end marker control instruction (twelve 1s).

TABLE 3

| Short Instruction Control Fields | |
|---|---|
| Control Field | Current Function |
| 1111 1111 0100 | not defined |
| 1111 1111 0101 | not defined |
| 1111 1111 0110 | not defined |
| ..... ..... .... | ... ....... |
| ..... ..... .... | ... ....... |
| 1111 1111 1110 | not defined |
| 1111 1111 1111 | end marker |

Although the present invention has been fully described above with reference to specific embodiments, other alternate embodiments may be apparent to those of ordinary skill in the art. For example, data words including multiple data bytes or partial data bytes may be sequentially compressed utilizing the apparatus and method described above. Therefore the above description should not be taken as limiting the scope of the present invention which is defined by the appended claim.

I claim:

1. A data manipulation apparatus comprising:
  a) means for receiving a data element;
  b) storage means for sequentially storing previously received data elements at sequentially addressed fixed locations; said storage means including first sequence means for sequentially and repetitively addressing said locations;
  c) means for comparing said received data element to said stored data elements to determine whether said received data element matches at least one of said stored data elements and to determine a fixed address of said matching stored data elements;
  d) detector means including a second sequence means for determining whether said received data element extends a previously stored matching data element string and producing an indicator for each of said fixed locations which is determined to extend a previously stored matching data element, said detector means operating concurrently with said means for comparing; said second sequence means having a plurality of detector cells corresponding to said fixed locations for storing said indicators; and means for sequentially advancing said indicators in said detector cells;
  e) a plurality of storage cells each receiving an output of one of said detector cells and providing an output representation of said indicators before said sequentially advancing occurs, whereby said output representation is provided if an indicator does not occur after said sequential advancing;
  f) means for providing a pointer to at least one of said matching stored data elements in response to said output representation, said pointer including said fixed address of said matching stored data elements and a length of said matching stored data elements.

2. The data manipulation apparatus of claim 1 further comprising means for transmitting any data elements that does not match said stored data elements and for transmitting addresses of matching stored data elements that have been generated.

3. The data manipulation apparatus of claim 2 wherein the receiving means includes means for receiving said data element as data words in sequence.

4. The data manipulation apparatus of claim 3 wherein the storage means includes means for sequentially storing previously received data words at sequentially addressed fixed locations.

5. The data manipulation apparatus of claim 1 wherein said storage means includes a non-shifting content addressable memory.

6. The data manipulation apparatus of claim 4 wherein the comparing means includes means for sequentially comparing each of said received data words to said stored data words.

7. The data manipulation apparatus of claim 6 wherein the generating means includes means for generating a length of at least one of said matching stored data elements.

8. A method of manipulating data comprising the steps of:
  a) receiving a data element;
  b) sequentially storing previously received data elements at sequentially addressed fixed locations;
  c) comparing said received data element to said stored data elements to determine whether said received data element matches at least one of said stored data elements and to determine a fixed address generating indicators of said matching stored data elements;
  d) determining in response to said indicators whether said received data element extends a previously stored matching data element string and storing indications in response thereto in a sequence of cells; said step of determining operating concurrently with said step of comparing; and sequentially advancing said indication in said sequence of cells;
  e) storing an output of said sequence of cells in a plurality of storage cells, and providing an output representation of said indications before said step of sequentially advancing occurs, whereby said output representation is provided if an indication does not occur after said sequential advancing;
  f) when a received data element does not extend a previously stored matching data element then providing a pointer to at least one of said matching stored data elements in response to said output representation, said pointer including said a fixed address of said matching stored data elements and a length of said matching stored data elements.

9. The method of claim 8 further comprising the step of transmitting any data element that does not match said stored data elements and transmitting addresses of matching stored data elements that have been generated.

10. The method of claim 9 wherein said step of receiving includes receiving data elements as data words in sequence.

11. The method of claim 10 wherein said step of storing includes sequentially storing previously received data words at sequentially addressable fixed addresses.

12. The method of claim 11 wherein said step of comparing includes sequentially comparing each of said received data words to said previously stored data words.

13. The method of claim 12 wherein said step of generating includes generating a length of at least one of said matching stored data elements.

14. A data processing system comprising:
  a host computer, said host computer including:
    a) processing means;
    b) memory means;
    c) input means;
    d) output means; and
    e) a data manipulation apparatus, said data manipulation apparatus including:
      i) means for receiving a data element;
      ii) storage means for sequentially storing previously received data elements at sequentially addressed fixed locations;

iii) means for comparing said received data element to said stored data elements to determine whether said received data element matches at least one of said stored data elements and to determine a fixed address of said matching stored data elements;

iv) detector means including a second sequence means for determining whether said received data element extends a previously stored matching data element string and producing an indicator for each of said fixed locations which is determined to extend a previously stored matching data element, said detector means of determining operating concurrently with said means for comparing; said second sequence means having a plurality of detector cells corresponding to said fixed locations for storing said indicators; and means for sequentially advancing said indicators in said detector cells;

v) a plurality of storage cells each receiving an output of one of said detector cells and providing an output representation of said indicators before said sequentially advancing occurs, whereby said output representation is provided if an indicator does not occur after said sequential advancing;

vi) means for providing a pointer to at least one of said matching stored data elements in response to said output representation, said pointer including said fixed address of said matching stored data elements and a length of said matching stored data elements.

15. The data processing system of claim 14 wherein said compression means manipulation apparatus further includes means for transmitting any data element that does not match said stored data elements and for transmitting addresses of matching stored data elements that have been generated.

16. The data processing system of claim 15 wherein said receiving means further includes means for receiving data elements as data words in sequence.

17. The data processing system of claim 16 wherein said storage means includes means for sequentially storing previously received data words at sequentially addressed fixed locations.

18. The data manipulation apparatus of claim 14 wherein said storage means includes a non-shifting content addressable memory.

19. The data processing system of claim 17 wherein said comparing means includes means for sequentially comparing each of said received data words to said stored data words.

20. The data processing system of claim 19 wherein said generating means includes means for generating a length of at least one of said matching stored data elements.

* * * * *